United States Patent [19]

Olson

[11] Patent Number: 5,508,328
[45] Date of Patent: Apr. 16, 1996

[54] CURING EPOXY RESINS USING DICY, IMIDAZOLE AND ACID

[75] Inventor: Larry D. Olson, Viroqua, Wis.

[73] Assignee: AlliedSignal Inc., Morris Township, Morris County, N.J.

[21] Appl. No.: 340,962

[22] Filed: Nov. 17, 1994

[51] Int. Cl.$^6$ .................................................. C08L 63/00
[52] U.S. Cl. .............................. 523/445; 528/88; 528/89; 528/90; 528/91; 528/93; 528/94; 528/407; 525/504
[58] Field of Search .............................. 523/445; 528/88, 528/89, 90, 91, 93, 94, 407; 525/504

[56] References Cited

U.S. PATENT DOCUMENTS

| | | | |
|---|---|---|---|
| 3,356,645 | 12/1967 | Warren | 260/47 |
| 3,438,937 | 4/1969 | Christie | 260/47 |
| 3,631,150 | 12/1971 | Green | 260/47 EN |
| 3,635,894 | 1/1972 | Dowbenko et al. | 260/47 |
| 3,677,978 | 7/1972 | Dowbenko et al. | 260/2 EP |
| 4,452,847 | 6/1984 | Siemon | 428/246 |
| 5,169,473 | 12/1992 | Bertram et al. | 156/307.4 |
| 5,308,895 | 5/1994 | Gan et al. | 523/445 |

FOREIGN PATENT DOCUMENTS

| | | |
|---|---|---|
| 236117 | 8/1959 | Australia . |
| 0458502A2 | 5/1991 | European Pat. Off. . |
| 915704 | 1/1959 | United Kingdom . |

*Primary Examiner*—Frederick Krass
*Attorney, Agent, or Firm*—Harold N. Wells; Roger H. Criss

[57] ABSTRACT

A curable epoxide composition consists essentially of curable epoxides, dicyandiamide as a curing agent in an amount less than needed to fully cure the epoxides, an imidazole in an amount exceeding that needed as a catalyst and capable of curing the epoxides in combination with the dicyandiamide, a reactivity controller for the imidazole to reduce the curing speed, and a solvent. The use of undesirable solvents such as DMF is reduced. A glass transition temperature greater than 135° C. is obtained in the cured composition and is maximized by balancing the amounts of dicyandiamide, the imidazole, and the reactivity controller.

19 Claims, No Drawings

CURING EPOXY RESINS USING DICY, IMIDAZOLE AND ACID

This invention is related to the field of reinforced epoxy laminates of the type used for electronic circuit boards. In particular, the invention relates to improved epoxy resin formulations which avoid the need for undesirable solvents and which provide higher glass transition temperatures (i.e. Tg) than have generally been provided by previous formulations.

Many curing agents have been used to prepare epoxy laminates, in particular, nitrogen-containing compounds. Imidazoles are one class of such nitrogen compounds. In U.S. Pat. No. 3,438,937 the use of imidazoles alone or in combination with other curing compounds are proposed. Imidazole salts are suggested, for example, in U.S. Pat. No. 3,356,645. U.S. Pat. No. 3, 677,978 discloses the use of metal salt-imidazole complexes. Combinations of imidazoles, their salts, and dicyandiamide have been recommended in such patents as U.S. Pat. Nos. 3,631,150, 4,452, 847, and 3,635,894. It may be concluded that combinations of imidazoles and dicyandiamide have been found to be particularly advantageous. However, the use of dicyandiamide as a curing agent requires the use of undesirable solvents if one wishes to solubilize the dicyandiamide so that it is uniformly distributed through the epoxy resin to be cured. Solvents such as dimethylformamide (DMF), N-methyl 2-pyrrolidone (NMP), methyl cellosolve (MC) and propylene glycol monomethyl ether are required. It is highly desirable to minimize their use to avoid health problems caused by exposure to these solvents and the costs associated with their disposal.

Another more recent patent published application, EP 0458502 A2, discloses the use of boric acid (or maleic acid) in combination with various catalysts, particularly imidazoles, and dicyandiamide to cure epoxy resins in laminates. The boric acid is said to inhibit the reaction of the epoxy resins at low temperatures. Also, it is stated that such epoxy resins when cured often demonstrate a higher Tg than other compositions, typically, 5° C. to 10° C. increase in Tg or more. The examples given in the application usually employ the combination of 2-methyl imidazole and dicyandiamide with boric acid. It is evident that the applicants prefer such a combination, which is similar to the combination of curing agents disclosed in the earlier patents discussed above. Related disclosures are made in U.S. Pat. No. 5,169,473 and in U.S. Pat. No. 5,308,895.

The present inventor has discovered that not all imidazoles give the same results. More specifically, he has found that 2-phenyl imidazole produces a much higher Tg than 2-methyl imidazole when the 2-phenyl imidazole is used in larger amounts than are common when it is used as an accelerator or catalyst. However, the curing speed is excessive. By including acids which can control the reactivity of the imidazoles, it becomes possible to employ such larger amounts of imidazoles, which could otherwise cause premature curing of the epoxy resin. Further, he has found that it is possible to reduce the use of dicyandiamide, making it possible to employ more environmentally acceptable solvents.

SUMMARY OF THE INVENTION

The invention in one embodiment is a curable epoxide composition consisting essentially of at least one difunctional epoxide, optionally including multifunctional epoxides, dicyandiamide as a curing agent in an amount less than required to cure the difunctional epoxides, an imidazole in an amount sufficient to reduce the gel time below about 120 seconds, a reactivity controller sufficient to reduce the reactivity of the imidazole and to obtain a gel time above about 120 seconds, a solvent capable of dissolving the dicyandiamide, and optionally a solvent selected from the group consisting of acetone, methyl ethyl ketone (MEK) propylene glycol monomethyl ether (PM), and ethyl alcohol.

Such a composition is capable of providing rapid curing under elevated temperatures and produces a glass transition temperature (Tg) in the cured epoxide composition of 135° C., preferably 150° C. or higher.

In a preferred embodiment the imidazole is 2-phenyl imidazole (2 PI) in an amount from 0.1 to 5 wt. % based on the epoxide content. The reactivity controller is boric acid in an amount from 0.1 to 10 wt. %. The Tg will preferably be about 160° C.–168° C.

In another aspect, the invention provides a method for increasing the Tg of a cured epoxy resin formulation. Less dicyandiamide is used than is needed to cure the epoxides. An amount of an imidazole is included which results in excessively rapid curing and an acid is added to reduce reactivity of the imidazole and provide an acceptable curing speed, that is, a gel time above about 120 seconds.

DESCRIPTION OF THE PREFERRED EMBODIMENTS

The invention provides a solution to two problems, namely, increasing the glass transition temperature (Tg) of a fully cured laminate and minimizing the use of environmentally undesirable solvents such as DMF (dimethyl formamide). The Tg is determined by the amount of crosslinking of the epoxy compounds, that is, increasing the amount of a crosslinking agent such as dicyandiamide (dicy) or using a multifunctional epoxy compound will raise the Tg value. Since the dicy is not readily soluble in epoxy compounds or in many solvents, undesirable solvents such as DMF, NMP, MC, and propylene glycol monomethyl ether are required and therefore the amount of dicy which can be used is limited. On the other hand, multifunctional epoxy compounds are generally more expensive than difunctional epoxy compounds, which limits their use in many applications where cost rather than performance governs. I have now found that by greatly increasing the amount of an imidazole, particularly 2-phenyl imidazole, which is usually used in small amounts (say about 0.01 to 0.2 wt. %) as an accelerator or catalyst, it is possible to reduce the amount of dicy used, while increasing the Tg of the fully cured epoxide formulation to about 150° C. or above, particularly 160° C. or above. A further advantage is that since less dicy is used, less of the objectionable solvents are needed. Only the amount needed to dissolve dicy is required.

Imidazoles have been suggested as curing agents for epoxy compounds, but typically have been used as accelerators in combination with dicyandiamide which provides the advantage of latent curing, that is, delayed curing at temperatures above about 150° C. 2-phenyl imidazole (2-PI) has been found to provide a higher Tg when used in large amounts, preferably up to 1.5 wt. %, as a crosslinker when compared to the more conventionally used 2-methyl imidazole. However, imidazoles such as 2-PI are too reactive at low temperatures and will cause gelling (the initial stage of curing) to occur too rapidly and ordinarily imidazoles such as 2-PI could not be used in this manner. This difficulty can be overcome by the addition of a sufficient amount of an acid, such as boric acid, which is believed to complex with the 2-PI so that its curing effect is delayed until high temperatures are reached. Contrary to the teachings of U.S. Pat. No. 5,308,895, it is not necessary to limit the amount of boric acid to about 2 parts per 100 parts of epoxide, much larger amounts can be used, up to 10 wt. %. Older patents such as GB 915,704 and AU 236,117 have suggested that bode acid alone can serve as a curing agent. In such cases large amounts up to 80 wt. % boric acid were recommended. While dicyandiamide is included in an epoxy formulation, it is necessary to reduce the amount used relative to the normal amount (about 2 to 4 wt. %) in order to take advantage of the higher Tg produced when large amounts of 2-PI are used. The amount of dicyandiamide is reduced as 2-PI is increased to optimize the Tg obtained from a given mixture of epoxides and typically the amount of dicyandiamide is reduced to about 0.1 to 4.0,wt. %, preferably less than about 2.0 wt. %.

In practice, the amount of dicyandiamide will be reduced below that needed to cure the epoxies and the amount of an imidazole will be increased, which will cause the "gel time" (see below) to fall below a desirable value, typically less than 120 seconds. In this condition, the epoxy formulation will cure too rapidly, affecting the degree of curing of B-stage prepregs. An acid is added to reduce the reactivity of the imidazole and return the gel time to above about 120 seconds. The balancing of the amounts of imidazole, dicyandiamide, and acid is important in order to provide the highest possible glass transition temperature in the fully-cured (C-stage) resin.

The "gel time" is the time required to "gel" an epoxy resin formulation at 171° C., using a test typical of those used in the industry. The steps of the test are:

1. Coat a hot plate surface with a release agent.
2. Pour 3.5 grams of an epoxy resin formulation on to the hot plate while maintaining the temperature at 171° C.±0.5° C.
3. Warm each side of a metal spatula for 30 seconds on the hot plate.
4. Stroke the resin with the heated spatula over a 2-inch square at about 1 stroke per second.
5. Continue the stroking of the resin until the resin becomes cloudy and viscous and can be lifted off the hot plate. The time measured between the application of epoxy resin in step 2 and the end of step 5 is the gel time.

It will be appreciated that the test is both empirical and convenient and does not require elaborate equipment. However, it is subject to variation due to operator technique and several tests are usually carried out and averaged.

Epoxies

Epoxies suitable for use in the invention will have more than one epoxy moiety. Difunctional epoxies may comprise a large proportion of the epoxide content of a formulation, optionally, multifunctional epoxies containing more than two epoxy moieties may be included, but they are not required since dicyandiamide will crosslink the difunctional epoxies.

Typical epoxies of the invention are polyglycidyl ethers of aromatic hydroxy compounds, particularly phenols, which are made by the reaction of epichlorohydrin with the hydroxy compounds. See for examples the discussion in the patents referenced above. Such epoxies are well known in the art and their selection is not part of the invention as presently understood, except for the distinction being made between difunctional and multifunctional epoxies. Epoxides frequently include halogens, particularly bromine, in order to provide flame retarding properties in the cured epoxide compositions.

Examples of compounds which are useful in the invention include the diglycidyl ethers of bisphenol-A, bisphenol F, bisphenol-C, dihydroxydiphenylethane, dihydroxydiphenylbutane, bis(hydroxyphenyl)tetramethyl xylidene, biphenol, tetramethylbiphenol, tetrabromotetrabromobiphenol, tetrabromobiphenol, resorcinol, tetrabromobisphenol-A, hydrogenated bisphenol-A, and bis(2,3-epoxy cyclopentyl)ether, limonene dioxide, 2,2-bis(3,4-epoxycyclohexyl)propane, dicyclopentadiene dioxide, the triglycidyl ether of triphenol methane, the triglycidyl ether of triphenol ethane, tri 2,3- epoxy propyl isocyanurate, tetraglycidyl ether tetraphenol ethane, tetraglycidyl ether methylene dianiline, perglycidyl ether novolac resin and oligomers, and chain extended oligomers based on diglycidyl ether of bisphenol-A and/or tetrabromobisphenol-A which have been reacted diisocyanates such as, tolylene diisocyanate, isophorone diisocyanate, dicyclohexylmethane-4,4'-diisocyanate, diphenylmethane diisocyanate or tetramethyl xylidene diisocyanate, and chain extended oligomers based on diglycidylether of bisphenol-A and/or tetrabromobisphenol-A which has been reacted with dicyanate esters of bisphenol-A, bisphenol-F, bisphenol-C, dihydroxydiphenylethane, and bis(hydroxyphenyl)tetramethylxylidene.

Chain Extenders

Optionally, an epoxy compound may be chain extended with compounds which react with the epoxide functionality of the resin to extend the polymer chain and in some cases to cross-link the epoxy compounds as well. The chain extending compounds typically will have at least two functional moieties and up to a maximum of about seven such moieties. The more familiar chain extenders include bisphenols, trisphenols, tetraphenols, multi-functional phenols, dicarboxylic acids, tricarboxylic acids, tetracarboxylic acids, phenol novolacs, cresol novolacs, and phenol carboxylic acids. Such compounds often contain halogens, particularly bromine, in order to impart flame retardent properties into the epoxy resin and the cured products.

Chain extenders of particular interest are: resorcinol, bisphenol-A, tetrabromo bisphenol-A, tetrachloro bisphenol-A, biphenol, tetrabromo biphenol, tetramethyl biphenol, hexamethyl biphenol, triphenol methane, triphenol ethane, hexabromo triphenol ethane, tetraphenol ethane, perbromo tetraphenol ethane, ortho cresol novolac resin, novolac resin, isophthalic acid, terephthalic acid, trimesic acid, pyromellitic acid, salicylic acid, and hydroxycinnamic acid and mixtures of these compounds.

Curing Agents

Curing agents may be defined as compounds which are included in an epoxy formulation for the purpose of reacting with the epoxide groups and cross-linking them. A commonly used curing agent is dicyandiamide (cyanoguanidine) which has the advantage of providing latent curing since it requires relatively high temperatures and thus can be added to an epoxy resin and stored at room temperature with a relatively long shelf life. It is capable of providing crosslinking when used in larger amounts, say 2.5 to 4 wt. %, but it is used in lesser amounts in this invention. Generally, the amount of dicyandiamide used is less than is needed to cure the epoxies. Compensation for the reduced amount of dicyandiamide is made by increasing the amount of an imidazole, usually included in small amounts as an accelerator or catalyst, but in this invention as an additional curing agent.

Dicyandiamide has the disadvantage of being insoluble in epoxy resins and consequently, undesirable solvents such as DMF are needed when it is used. More recently, it has been suggested that derivatives of dicyandiamide may be used to overcome the solubility problem. While it is a useful curing agent, reducing its use would be desirable to minimize the need for undesirable solvents. This is possible with the epoxy formulations of the present invention, where imidazoles, particularly 2-phenyl imidazole are used in large amounts as curing agents, rather than as an accelerators or catalysts.

Alternative curing agents which can be utilized are monosubstituted dicyandiamides such as: N-benzyldicyandiamide, N-(4-methylbenzyl)dicyandiamide, N-(4-methoxybenzyl)dicyandiamide, N-phenethyldicyandiamide; N-(4-methylphenethyl)dicyandiamide; and N-(4-methoxyphenethyl)dicyandiamide.

Catalysts

The curing agents discussed above are used in relatively large amounts. In order to accelerate the curing process, small amounts of other compounds are often included, which may be referred to as accelerators or catalysts for the curing reactions. Additionally, nitrogen-based or phosphorous-based compounds may be used to facilitate the reaction of the epoxy resin with any chain extenders which may be included.

The nitrogen-based compounds are able to accelerate the curing of the epoxy resins. Examples include amines and for purposes of the present invention in particular, imidazoles. Examples of useful imidazoles include imidazole, 1-methyl imidazole, 2-methyl imidazole, 2-methyl-4,5-dinitro imidazole, 4-methyl imidazole, 2-ethyl-4-methyl imidazole, 2-ethyl imidazole, 1,2-dimethyl imidazole, 2-phenyl imidazole, 4,5-dinitroimidazole, 4-phenylimidazole, and 1-vinyl imidazole. A frequently used imidazole is 2-methyl imidazole. The present inventor has found that 2-phenyl imidazole is particularly valuable when used in larger quantities than are usual for catalysts. The amount used may be between about 0.1 to 5.0 wt. %. However, to prevent premature gelling of the formulation a reactivity controller, such as acids which can react with the imidazoles, is included to reduce the curing speed.

Reactivity Controllers

When large amount of imidazoles are used, they must be controlled to avoid premature gelling of the epoxy formulation. Various acids have been proposed which can react or complex with imidazoles so that an elevated temperature is needed in order for them to react with epoxides. Examples of such acids include boric acid, salicylic acid, hydrochloric acid, sulfuric acid, oxalic acid, terephthalic acid, isophthalic acid, phosphoric acid, acetic acid, lactic acid, phenylboric acid, and toluenesulfonic acid.

In U.S. Pat. No. 5,308,895 boric acid is disclosed to be an inhibitor of epoxy resin curing. Curing is delayed at the temperatures needed to remove solvents from an epoxy resin formulation. In addition to the boric acid (or alternatively maleic acid) catalysts and curing agents are suggested for their conventional purposes. Typical formulations of the examples of the '895 patent include an epoxy resin, a chain extender, dicyandiamide, 2-methyl imidazole, and boric acid.

In the present invention, boric acid may be used to control the reactivity of the epoxy resin formulation in amounts from 0.1 to 10 wt. % based on the epoxy resin, preferably from 0.5 to 3 wt. %. It has been found that addition of the boric acid along with relatively large amounts of 2-phenyl imidazole provides a significantly improved glass transition temperature (Tg) than a more conventional formulation and reduces the use of undesirable solvents.

Alternatively, other acids such as those mentioned above may be used, particularly isophthalic acid, hydrochloric acid, and acetic acid.

Preparation of Laminates

Reinforced laminates for the electronics industry may be prepared from the compositions of the invention which have improved Tg and which minimize the use of undesirable solvents. The methods of making such laminates are well known to those skilled in the art and need not be discussed in detail here. In general, the fabric which is to be used to reinforce the laminate, typically made of glass fibers, is coated with epoxy resins combined with the crosslinking agents, chain extenders, curing agents, and catalysts as described above. The coated fabric is heated to remove the solvents and to cause the curing reactions to occur. When only a partial cure is carried out, the resulting product is often referred to as a "prepreg" or "B-stage" material. Such prepregs are later heated to higher temperatures in order to complete the cure ("C-stage") during the manufacture of electronic circuit boards.

EXAMPLE 1

Comparative

An epoxy resin formulation (a conventional FR-4 epoxy) was prepared having the following proportions.

| Component | Amount (phr*) |
| --- | --- |
| Dow 71881 difunctional epoxy | 100 |
| Dow XD-9053 tetrafunctional epoxy | 10 |
| DMF (dimethylformamide) | 15 |
| 2-methyl imidazole | 0.1 |
| acetone | 5 |
| dicyandiamide | 2.7 |

*phr = pounds per hundred of resin

DMF was present to dissolve the dicyandiamide. 2-Methyl imidazole was present in a small amount as a catalyst. The composition lacked a reactivity controller for the imidazole. The resin formulation was coated on a woven glass fabric (7628 Clark-Schwebel). The coated fabric was held at 170° C. for 3.5 minutes to achieve B-stage and then cured to C-stage by pressing at 175° C. for 1.5 hours. The glass transition temperature of the cured resin measured by differential scanning calorimeter (DSC) to be 142° C.

EXAMPLE 2

A second epoxy resin formulation was prepared as in Example 1 except that the amount of dicyandiamide was reduced and 2-phenyl imidazole replaced 2-methyl imidazole, but in much greater amounts. Boric acid was added as a reactivity controller to prevent early gelling. The formulation was as follows:

| Component | Amount, phr |
|---|---|
| Dow 71881 | 100 |
| Dow XD-9053 | 10 |
| DMF | 15 |
| 2-phenyl imidazole | 1.2 |
| acetone | 5 |
| dicyandiamide | 2.0 |
| boric acid | 0.4 |

Again, the coated fabric was held at 170° C. for 2.5 minutes and then was cured to C-stage by pressing at 175° C. for 1.0 hour. In this instance, the Tg was found to be 160°–168° C., substantially higher than in Example 1, despite the use of 25% less of the curing agent dicyandiamide.

EXAMPLE 3

A series of epoxide compositions were prepared, each of which used boric acid as a reactivity controller for 2-phenyl imidazole. The formulations are given in the following table.

| Component | A | B | C | D | E | F | G |
|---|---|---|---|---|---|---|---|
| Dow 71881 (1) | .7960 | — | — | .7301 | .7149 | .5431 | — |
| EPON828 (2) | — | .6182 | .5354 | — | — | — | — |
| 592A80 (3) | — | — | — | — | — | — | .7523 |
| 1031A70 (4) | — | — | — | — | .0770 | .1997 | .0347 |
| DMF | .1472 | — | .1637 | .1324 | .1850 | .1924 | .1840 |
| DICY | .0127 | — | .0137 | .0130 | .0125 | .0117 | .0187 |
| Boric Acid | .0026 | .0024 | .0021 | .0026 | .0025 | .0024 | .0024 |
| 2PI | .0090 | .0081 | .0070 | .0084 | .0081 | .0069 | .0078 |
| L122 (5) | — | — | — | — | — | — | .0001 |
| Acetone | .0325 | — | — | .0550 | — | .0438 | — |
| 9053 (6) | — | — | — | .0585 | — | — | — |
| TBBPA (7) | — | .3177 | .2752 | — | — | — | — |
| TBPA (8) | — | .0018 | .0029 | — | — | — | — |
| BZDICY (9) | — | .0309 | — | — | — | — | — |
| BGE (10) | — | .0185 | — | — | — | — | — |
| Acetic Acid | — | .0024 | — | — | — | — | — |

Notes:
(1) diglycidyl ether of tetrabromobisphenol A
(2) Shell, diglycidyl ether of bisphenol A
(3) Dow, multifunctional epoxy
(4) Shell, epoxidized tetraphenol ethane
(5) BASF, polyol surfactant
(6) Dow, multifunctional epoxy novolac
(7) tetrabromo bisphenol A
(8) tetrabutyl phosphonium acetate
(9) benzyl dicyandiamide
(10) butyl glycidl ether Each composition was applied to a glass fabric as described and cured to C-stage at 175° C. in a press. Laminates having 6 mil (0.15 mm) and 28 mil (0.71 mm) thicknesses were prepared and the physical properties measured. All of the properties met Mil Spec 13949 rev H. Certain properties of particular interest are reported in the table below and compared with the same formulation (control) in which 2-methyl imidazole (0.001 weight fraction) and dicyandiamide (0.027 weight fraction) were used instead of 2-phenyl imidazole and boric acid.

| | Composition | | | | | |
|---|---|---|---|---|---|---|
| | A | | A control | | D | |
| Test | 6 mil | 28 mil | 6 mil | 28 mil | 6 mil | 28 mil |
| Solder Float[1], sec. | 133 | 104 | 201 | 192 | 175 | 125 |
| $H_2SO_4$[2], wt. % | 8.17 | 1.29 | 8.89 | 1.52 | 3.26 | 0.71 |
| $MeCl_2$[3], wt. % | 8.99 | 1.60 | 9.92 | 2.31 | 6.26 | 1.31 |
| Press Cooker-30[4] | 5 | 5 | 5 | 5 | 5 | 4-4-5 |
| Press Cooker-60 | 5 | 5 | 5 | 5 | 5 | 3-5-4 |
| NMP[5], wt. % | 1.09 | 0.23 | 3.79 | 1.19 | 0.69 | 0.06 |
| T-260[6], min | 11.23 | 9.3 | 16.60 | 14.2 | 16.28 | 10.7 |
| Td[7], °C. | 297 | 297 | 307 | 306 | 299 | 300 |
| Tg[8], °C. | 148 | 140 | 133 | 128 | 155 | 146 |

| | D control | | E | | E control | |
|---|---|---|---|---|---|---|
| Test | 6 mil | 28 mil | 6 mil | 28 mil | 6 mil | 28 mil |
| Solder Float[1], sec. | 227 | 211 | 176 | 127 | 212 | 217 |
| $H_2SO_4$[2], wt. % | 6.12 | 0.91 | 3.92 | 0.78 | 5.27 | 0.05 |
| $MeCl_2$[3], wt. % | 4.58 | 1.13 | 6.05 | 1.32 | 5.18 | 1.23 |
| Press Cooker-30[4] | 5 | 5 | 5 | 4-5-4 | 5 | 5 |
| Press Cooker-60 | 5 | 4-5-5 | 5 | 4-3-3 | 5 | 5 |
| NMP[5], wt. % | 1.37 | 0.27 | 1.12 | 0.18 | 1.17 | 0.14 |
| T-260[6], min | 21.18 | 15.9 | 15.47 | 11.6 | 21.17 | 18.0 |
| Td[7], °C. | 307 | 306 | 300 | 299 | 307 | 308 |
| Tg[8], °C. | 140 | 135 | 153 | 141 | 141 | 141 |

| | F | | F control | |
|---|---|---|---|---|
| Test | 6 mil | 28 mil | 6 mil | 28 mil |
| Solder Float[1], sec. | 264 | 294 | 273 | 225 |
| $H_2SO_4$[2], wt. % | −0.35 | 0.10 | 0.86 | 0.04 |
| $MeCl_2$[3], wt. % | 3.17 | 0.51 | 1.92 | 0.42 |
| Press Cooker-30[4] | 5 | 4 | 5 | 4-5-5 |
| Press Cooker-60 | 5 | 3-3-5 | 5 | 3 |
| NMP[5], wt. % | 1.01 | 0.13 | 0.91 | 0.10 |
| T-260[6], min | 24.78 | 18.8 | 28.22 | 25.5 |
| Td[7], °C. | 306 | 306 | 312 | 312 |
| Tg[8], °C. | 170 | 162 | 137 | 132 |

(1) time to failure in 550° C. solder bath
(2) percent weight loss after 30 seconds in concentrated $H_2SO_4$ at room temperature
(3) percent weight gain after 20 minutes submersion in $MeCl_2$ at room temperature
(4) IPC method for rating delamination (5 best–0 delamination) after exposure to boiling water at 100° C. for 30 or 60 minutes
(5) percent weight gain after submersion in NMP at room temperature
(6) minutes to delamination when exposed to molten solder at 550° F. (288° C.)
(7) decomposition temperature measured by thermomechanical analysis
(8) glass transition temperature measured by DSC

EXAMPLE 4

Two epoxy formulations were prepared having the same gel time (150 sec), one containing boric acid (I) and the second omitting it (H). The amount of 2 PI used was increased by a factor of three in sample I.

| | Weight fraction | |
|---|---|---|
| Component | H | I |
| Dow 71881 | 0.7200 | 0.7146 |
| Shell 1031 | 0.0800 | 0.0774 |
| dicyandiamide | 0.0125 | 0.0124 |
| DMF | 0.1860 | 0.1846 |
| 2PI | 0.0025 | 0.0081 |
| Boric Acid | — | 0.0025 |

The compositions were used to prepare 10 mil (0.25 mm) and 28 mil (0.71 mm) sheets of glass fabric reinforced cured epoxy resins. The average Tg for the laminates made from Composition I was higher than for those made from Composition H, as shown in the following table.

| Laminate | Tg, °C. | |
| --- | --- | --- |
| | H | I |
| 10 mil | 132.8 | 150.5 |
| 28 mil | 128.8 | 146.5 |

2PI (2-phenyl imidazole) has been found to provide higher values for Tg than other familiar imidazoles. An epoxy formulation containing the curing agent dicyandiamide was cured with four imidazoles plus one urea compound. The compositions were as follows

| | Weight fraction | | | | |
| --- | --- | --- | --- | --- | --- |
| Component | I | K | L | M | N |
| Dow 71881 | 0.7301 | 0.7301 | 0.7301 | 0.7301 | 0.7301 |
| Dow XD 9053 | 0.0585 | 0.0585 | 0.0585 | 0.0585 | 0.0585 |
| Dicyandiamide | 0.0130 | 0.0130 | 0.0130 | 0.0130 | 0.0130 |
| DMF | 0.1324 | 0.1324 | 0.1324 | 0.1324 | 0.1324 |
| acetone | 0.0550 | 0.0550 | 0.0550 | 0.0550 | 0.0550 |
| boric acid | 0.0026 | 0.0026 | 0.0026 | 0.0026 | 0.0026 |
| imidazole | 0.0038 | — | — | — | — |
| 2-methyl imidazole | — | 0.0045 | — | — | — |
| 2-phenyl imidazole | — | — | 0.0084 | — | — |
| 2-ethyl, 4-methyl imidazole | — | — | — | 0.0084 | — |
| 1-phenyl 3,3-dimethyl urea | — | — | — | — | 0.0168 |

Each composition was applied to a glass fabric and fully cured at 175° C. in a press. The resulting Tg for each composition was:

| | I | K | L | M | N |
| --- | --- | --- | --- | --- | --- |
| Tg, °C. | 147 | 144 | 155 | 145 | 135 |

Again it can be seen that the composition using 2PI(L) gave the highest Tg value.

EXAMPLE 6

Three epoxy resin formulations were cured using various imidazoles and amines, with the addition of various acids to the extent needed to achieve a gel time of at least 120 seconds. As in previous examples each resin formulation was held at 170° C. for about 3.5 minutes to achieve B-stage curing and then pressed at 175° C. for about 1.5 hours to fully cure the resin to the C-stage. The glass transition temperature of the cured resin was measured by DSC. The formulations excluding the curing agents and acids are given in the following Table

| | Amount (phr) | | |
| --- | --- | --- | --- |
| Component | A | B | C |
| DOW 71881 A80 resin | 125 | 112 | 112 |
| Shell 1031 A70 resin | — | 14 | — |
| Dow 9053 resin | — | — | 10 |
| dicyandiamide | 2.7 | 2.7 | 2.7 |
| DMF | 23 | 23 | 23 |
| Acetone | 6 | 6 | 6 |

The results of the Tg tests are given in the following table where the amounts of the imidazole or amine and the acid are indicated (as phr) next to the description.

| Acid (phr) | Imidazole/Amine (phr) | Resin formula | Tg, °C. |
| --- | --- | --- | --- |
| Boric acid (0.45) | 2PI(a) (1.3) | A | 155 |
| Bisphenol A (1.2) | 2PI (1.3) | A | 135 |
| Salicylic Acid (1.2) | 2PI (1.3) | A | 140 |
| HCl (0.3) | 2PI (1.3) | A | 135 |
| $H_2SO_4$ (0.6) | 2PI (1.3) | A | 99 |
| Boric Acid (0.45) | 2PI (1.3) | B | 152 |
| Boric Acid (0.40) | 2MI(b) (6.45) | B | 146 |
| Salicylic Acid (1.2) | 2PI (1.3) | B | 140 |
| Oxalic Acid (0.35) | 2MI (0.38) | B | 118 |
| Manganese Octoate (0.6) | 2PI (1.3) | B | 132 |
| Resorcinol (1.2) | 2PI (1.3) | B | 132 |
| Terephthalic Acid (0.6) | 2PI (1.3) | B | 132 |
| HCl (0.3) | 2PI (1.3) | B | 131 |
| Isophthalic Acid (0.5) | 2PI (1.3) | B | 143 |
| Phosphoric Acid (0.6) | 2MI (0.8) | C | 128 |
| HCl (0.4) | 2MI (0.6) | C | 131 |
| HCl (0.3) | 2PI (1.3) | C | 131 |
| HCl (0.3) | IM(c) (0.25) | C | 127 |
| HCl (0.3) | BDMA(d) (1.6) | C | 122 |

(a) 2-phenyl imidazole
(b) 2-methyl imidazole
(c) imidazole
(d) biphenyl dimethyl amine It can be seen that 2-phenyl imidazole provides the highest Tg when combined with boric acid. Other acids and imidazoles or amines are useful, provided that the highest possible Tg is not required.

I claim:

1. A curable epoxide composition consisting essentially of
    (a) at least one curable difunctional epoxide, optionally with one or more epoxies having a functionality greater than two;
    (b) as a curing agent, dicyandiamide in an amount less than required to cure the epoxides of (a) but sufficient to provide a gel time greater than about 120° C.;
    (c) an amount of an imidazole sufficient to reduce the gel time below about 120 sec. when added to (a) and (b);
    (d) as a reactivity controller for the imidazole of (c), an acid capable of reacting with said imidazole of (c) in an amount sufficient to obtain a gel time greater than about 120 seconds when added to (a), (b) and (c);
    (e) a solvent sufficient to dissolve dicyandiamide, optionally with at least one additional solvent selected from the group consisting of acetone, methyl ethyl ketone, and ethyl alcohol; and
    (f) optionally a chain-extender for said epoxides and a catalyst for reacting said chain extender with said epoxides.

2. A composition of claim 1 wherein said reactivity controller of (d) is at least one member of the group consisting of boric acid, salicylic acid, hydrochloric acid, sulfuric acid, oxalic acid, terephthalic acid, isophthalic acid, phosphoric acid, acetic acid, lactic acid, phenylboric acid, and toluene sulfonic acid.

3. A composition of claim 1 wherein said chain extender of (f) is at least one member of the group consisting of resorcinol, bisphenol-A, tetrabromo bisphenol-A, tetrachloro bisphenol-A, biphenol, tetrabromo biphenol, tetramethyl biphenol, hexamethyl biphenol, triphenol methane, triphenol ethane, hexabromo triphenol ethane, tetraphenol ethane, perbromo tetraphenol ethane, ortho cresol novolac resin, novolac resin, isophthalic acid, terephthalic acid, trimesic acid, pyromellitic acid, salicylic acid, and hydroxycinnamic acid and mixtures of these compounds.

4. A composition of claim 2 wherein said reactivity controller is boric acid.

5. A composition of claim 4 wherein said boric acid is present in an amount of 0.1 to 10 wt. %, based on the weight of (a).

6. A composition of claim 1 wherein said imidazole is 2-phenyl imidazole.

7. A composition of claim 6 wherein said imidazole is present in an amount of 0.1 to 5.0 wt. % based on the weight of (a).

8. A composition of claim 1 wherein said difunctional epoxide is at least one member of the group consisting of the diglycidyl ethers of bisphenol-A, bisphenol-F, bisphenol-C, dihydroxy diphenylethane, dihydroxy diphenyl butane, bis(hydroxyphenyl), tetramethyl xylidene, bis(hydroxyphenyl) biphenol, tetramethylbiphenol, tetrabromobiphenol, tetrabromobiphenol, resorcinol, tetrabromobisphenol-A, hydrogenated bisphenol-A, bis(2,3-epoxycyclopentyl)ether, limonene dioxide, 2,2-bis(3,4-epoxycyclohexyl)propane, dicyclopentadiene dioxide, and chain extended oligomers based on the diglycidyl ethers of bisphenol A and/or tetrabromobisphenol-A which have been reacted with diisocyanates, and chain extended oligomers based on the diglycidyl ethers of bisphenol-A and/or tetrabromobisphenol-A which have been reacted with cyanate esters of bisphenol-A, bisphenol-F, bisphenol-C, dihydroxy diphenylethane, or bis(hydroxyphenyl) tetramethyl xylidene.

9. A composition of claim 1 wherein said epoxides having a functionality greater than two are at least one member of the group consisting of the triglycidyl ether of triphenol methane, the triglycidyl ether of triphenol ethane, tri 2,3-epoxy propyl isocyanurate, the tetraglycidyl ether of tetraphenol ethane, the tetraglycidyl ether of methylene dianiline, and the perglycidyl ether of novolac resin.

10. A composition of claim 1 wherein said solvent for the dicyandiamide is at least one member of the group consisting of dimethylformamide, N-methyl 2-pyrolidone, methyl cellosolve, and propylene glycol monomethyl ether.

11. A composition of claim 1 wherein the amount of dicyandiamide is between about 0.1 to 4.0 wt. % based on the epoxides of (a).

12. A composition of claim 11 wherein the amount of dicyandiamide is less than about 2.0 wt. % based on the epoxides of (a).

13. A cured composition of claim 1 wherein the glass transition temperature is at least 135° C.

14. A cured composition of claim 13 wherein the glass transition temperature is at least 150° C.

15. A cured composition of claim 14 wherein the glass transition temperature is about 160° C. to 168° C.

16. A method of increasing the glass transition temperature (Tg) of a cured epoxy formulation comprising the steps of:

(a) adding to uncured epoxide resins an mount of dicyandiamide less than required to fully cure said resins but sufficient to provide a gel time greater than about 120° C. and a solvent sufficient to dissolve said dicyandiamide;

(c) adding to the mixture of epoxy resins and dicyandiamide of (a) an mount of an imidazole sufficient to fully cure said resins in combination with said dicyandiamide and to reduce the gel time below about 120 seconds when added to (a);

(c) adding to the mixture of epoxy resins, dicyandiamide, and imidazole of (b) an amount of an acid capable of controlling the reactivity of said imidazole and of increasing the gel time above about 120 seconds when added to (a) and (b);

(d) repeating the steps of (a), (b), and (c) to determine the proportions of said dicyandiamide, imidazole, and acid which provide a predetermined glass transition temperature of said epoxy resins when fully cured.

17. The method of claim 16 wherein said acid is at least one member of the group consisting of boric acid, salicylic acid, hydrochloric acid, sulfuric acid, oxalic acid, terephthalic acid, isophthalic acid, phosphoric acid, acetic acid, lactic acid, phenyl boric acid, and toluene sulfonic acid.

18. The method of claim 17 wherein said acid is boric acid.

19. The method of claim 16 wherein said solvent is at least one member of the group consisting of dimethylformamide, N-methyl 2-pyrolidone, methyl cellosolve, and propylene glycol monomethyl ether.

* * * * *

UNITED STATES PATENT AND TRADEMARK OFFICE
CERTIFICATE OF CORRECTION

PATENT NO. : 5,508,328
DATED : April 16, 1996
INVENTOR(S) : Larry D. Olson

It is certified that error appears in the above-indentified patent and that said Letters Patent is hereby corrected as shown below:

Column 3, line 8: "bode" should read --boric--
Column 9, line 21: column indicated by "I" should be --J--
Column 9, line 40: column indicated by "I" should be --J--
Column 12, line 16: "an mount of" should read --an amount of--
Column 12, line 21: "an mount of" should read --an amount of--

Signed and Sealed this

Third Day of September, 1996

Attest:

BRUCE LEHMAN

Attesting Officer

Commissioner of Patents and Trademarks